United States Patent
Lim

(10) Patent No.: US 9,208,879 B2
(45) Date of Patent: Dec. 8, 2015

(54) FAIL ADDRESS DETECTOR, SEMICONDUCTOR MEMORY DEVICE INCLUDING THE SAME AND METHOD OF DETECTING FAIL ADDRESS

(71) Applicant: Sang Oh Lim, Icheon-si (KR)

(72) Inventor: Sang Oh Lim, Icheon-si (KR)

(73) Assignee: SK HYNIX INC., Icheon-Si, Gyeonggi-Do (KR)

( * ) Notice: Subject to any disclaimer, the term of this patent is extended or adjusted under 35 U.S.C. 154(b) by 218 days.

(21) Appl. No.: 13/717,139

(22) Filed: Dec. 17, 2012

(65) Prior Publication Data

US 2014/0029363 A1    Jan. 30, 2014

(30) Foreign Application Priority Data

Jul. 26, 2012   (KR) .................. 10-2012-0081809

(51) Int. Cl.
| | |
|---|---|
| G11C 15/04 | (2006.01) |
| G11C 15/00 | (2006.01) |
| G11C 29/04 | (2006.01) |
| G11C 29/44 | (2006.01) |
| G11C 29/00 | (2006.01) |

(52) U.S. Cl.
CPC ................ *G11C 15/04* (2013.01); *G11C 15/00* (2013.01); *G11C 15/046* (2013.01); *G11C 29/04* (2013.01); *G11C 29/789* (2013.01); *G11C 2029/4402* (2013.01)

(58) Field of Classification Search
CPC ....... G11C 15/00; G11C 15/04; G11C 15/046
USPC .................... 365/49.1, 49.16, 49.17
See application file for complete search history.

(56) References Cited

U.S. PATENT DOCUMENTS

| | | | | |
|---|---|---|---|---|
| 7,113,415 | B1 * | 9/2006 | Khanna ....................... | 365/49.16 |
| 7,251,707 | B1 * | 7/2007 | Pereira .......................... | 711/108 |
| 7,336,549 | B2 | 2/2008 | Min et al. | |
| 7,525,828 | B2 * | 4/2009 | Yabe ............................ | 365/49.1 |
| 8,031,501 | B1 * | 10/2011 | Nataraj et al. .............. | 365/49.1 |

FOREIGN PATENT DOCUMENTS

| | | |
|---|---|---|
| KR | 10-2001-0004903 | 1/2001 |
| KR | 10-2004-0061836 | 7/2004 |

* cited by examiner

*Primary Examiner* — Vanthu Nguyen
(74) *Attorney, Agent, or Firm* — Hauptman Ham, LLP

(57) ABSTRACT

A fail address detector includes cam latch groups configured to store fail addresses and a comparing section connected to the cam latch groups in common and configured to detect whether or not a fail address corresponding to a comparison address exists among the fail addresses received from the cam latch groups. The cam latch groups share the comparing section in time division.

19 Claims, 7 Drawing Sheets

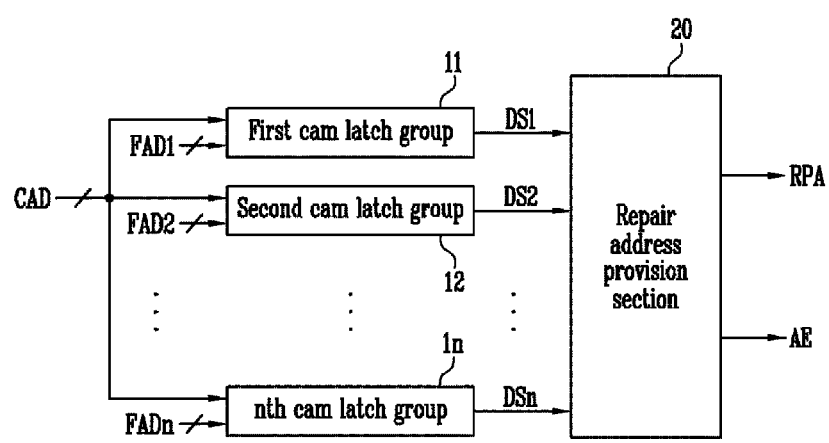
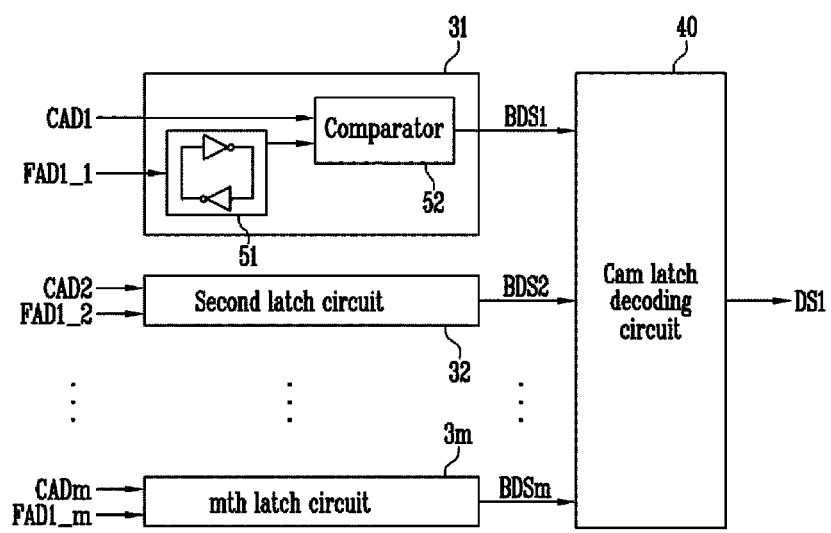

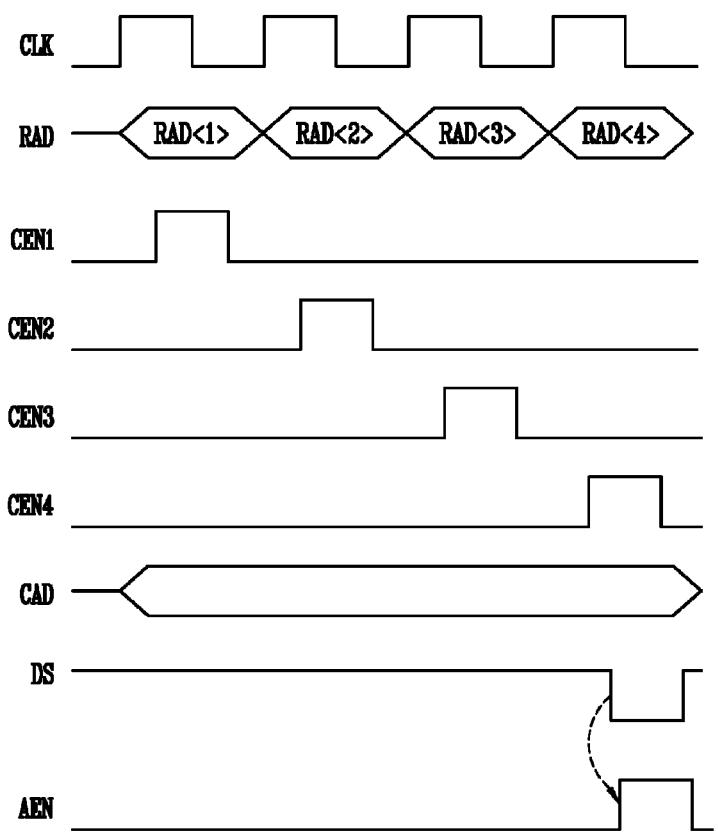

FAIL ADDRESS DETECTOR, SEMICONDUCTOR MEMORY DEVICE INCLUDING THE SAME AND METHOD OF DETECTING FAIL ADDRESS

CROSS-REFERENCE TO RELATED APPLICATION

This application claims priority from Korean Patent Application No. 10-2012-0081809, filed on Jul. 26, 2012, the content of which is incorporated herein by reference in its entirety.

BACKGROUND

The present disclosure relates to a semiconductor device, more particularly relates to a fail address detector, a semiconductor memory device including the same and a method of detecting fail address.

A semiconductor memory device is a memory device embodied by a semiconductor, such as silicon (Si), germanium (Ge), gallium arsenide (GaAs), indium phosphide (InP), etc. A semiconductor memory device is classified into a volatile memory device and a non-volatile memory device.

A volatile memory device is a memory device where stored data becomes lost if power is not supplied. Examples of a volatile memory device include a static RAM (SRAM), a dynamic RAM (DRAM), a synchronous DRAM (SDRAM) and so on. A non-volatile memory device is a memory device where stored data remains even though power is not supplied. Examples of a non-volatile memory device include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), etc. A flash memory device is classified into a NOR type memory device and a NAND type memory device.

A semiconductor memory device includes a fail address detector for replacing an abnormal area with a redundancy area if the abnormal area exists in, for example, a memory cell array. The fail address detector loads a fail address representing the abnormal area when, for example, the semiconductor memory device is powered-up. The fail address detector compares the loaded fail address with a received address. If the loaded fail address is identical to the received address, the received address is replaced with a repair address representing the redundancy area.

SUMMARY

A fail address detector according to at least one embodiment includes cam latch groups configured to store fail addresses, respectively, and a comparing section connected in common to the cam latch groups. The comparing section is configured to detect whether or not a fail address corresponding to a comparison address exists among the fail addresses received from the cam latch groups. The cam latch groups are configured to share the comparing section in time division.

In a method of detecting fail address according to at least one embodiment, fail addresses are loaded to cam latch groups, respectively, and are provided in sequence to a comparing section connected in common to the cam latch groups. The fail addresses provided from the cam latch groups to the comparing section are sequentially compared with a comparison address to detect whether or not a fail address corresponding to the comparison address exists among the fail addresses.

A semiconductor memory device according to at least one embodiment includes a memory cell array, a peripheral circuit configured to drive the memory cell array, and a control logic configured to control the peripheral circuit. The control logic includes cam latch groups configured to store fail addresses loaded from the memory cell array, and a comparing section which is connected to the cam latch groups in common to be shared in time division by the cam latch groups. The comparing section is configured to detect whether or not a fail address corresponding a comparison address exists among the fail addresses received from the cam latch groups.

BRIEF DESCRIPTION OF THE DRAWINGS

The above and other features and advantages of various embodiments will become readily apparent by reference to the following detailed description when considered in conjunction with the accompanying drawings wherein:

FIG. 1 is a block diagram of a fail address detector;

FIG. 2 is a block diagram of one cam latch group in the fail address detector of FIG. 1;

FIG. 10 is a timing diagram of operation of the fail address detector in FIG. 5, according to at least one example embodiment.

DESCRIPTION OF EXAMPLE EMBODIMENTS

Figure 3:
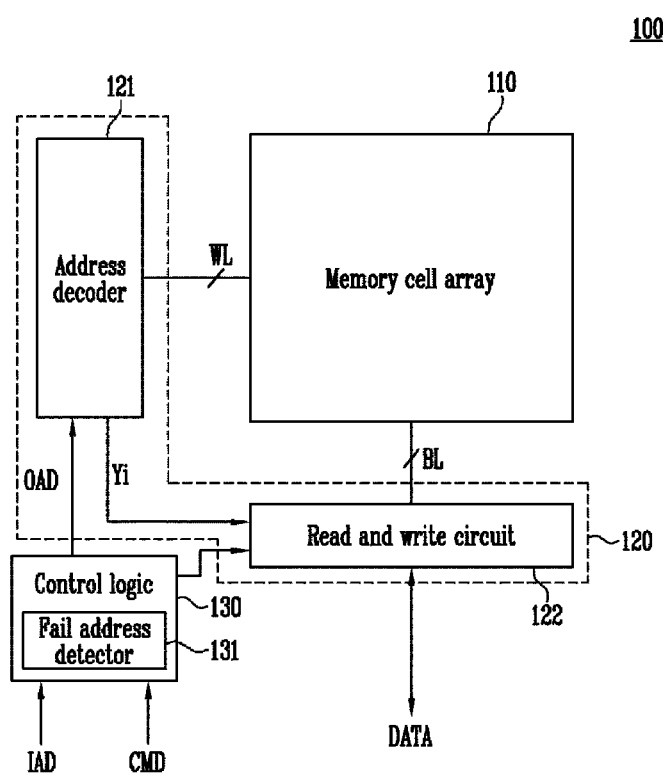
FIG. 3 is a block diagram of a semiconductor memory device according to at least one example embodiment.

Hereinafter, various embodiments will be explained in more detail with reference to the accompanying drawings. It should be understood that numerous other modifications and embodiments can be devised by those skilled in the art that will fall within the spirit and scope of the principles of this disclosure.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

FIG. 1 is a block diagram of a fail address detector. FIG. 2 is a block diagram of one cam latch group in the fail address detector of FIG. 1.

In FIG. 1, a fail address detector 1 includes a first to an nth cam latch groups 11~1n and a repair address provision section 20.

The first to the nth cam latch groups 11~1n receive a first to an nth fail addresses FAD1~FADn, respectively. The first to the nth cam latch groups 11~1n latch the received first to nth fail addresses FAD1~FADn, respectively. Additionally, each of the first to the nth cam latch groups 11~1n receives a comparison address CAD, respectively.

In FIG. 2, the cam latch group 11 includes a first to an mth latch circuits 31~3m and a cam latch decoding circuit 40. The first to the mth latch circuits 31~3m receive a first to an mth bits CAD1~CADm of the comparison address CAD, respectively. Furthermore, the first to the mth latch circuits 31~3m receive a first to an mth bits FAD1_1~FAD1_m of a first fail address FAD1, respectively.

The first latch circuit 31 includes a latch block 51 and a comparator 52. The latch block 51 stores the first bit FAD1_1 of the first fail address FAD1. The comparator 52 detects whether or not the first bit FAD1_1 of the first fail address FAD1 is identical to the first bit CAD1 of the comparison address CAD. The comparator 52 activates or deactivates a first bit detection signal BDS1.

Detailed configurations of the second to the mth latch circuits 32~3m are omitted for convenience of illustration and description in FIG. 2. Each of the second to the mth latch circuits 32~3m has a configuration similar to the first latch circuit 31. The second to the mth latch circuits 32~3m activate or deactivate a second to an mth bit detection signals BDS2~BDSm, respectively.

The cam latch decoding circuit 40 activates a first detection signal DS1 when the first to the mth bit detection signals BDS1~BDSm are all activated. The cam latch decoding circuit 40 deactivates the first detection signal DS1 when any one of the first to the mth bit detection signals BDS1~BDSm is deactivated.

As a result, the first detection signal DS1 is activated when the comparison address CAD is identical to the first fail address FAD1.

Now referring to FIG. 1, the second to the nth cam latch groups 12~1n have the same configuration as the first cam latch group 11. The second to the nth cam latch groups 12~1n compare the comparison address CAD with corresponding fail addresses, and generate a second to an nth detection signals DS2~DSn according to the comparing result.

It is determined according to the first to the nth detection signals DS1~DSn whether or not a fail address identical to the comparison address CAD exists in the first to the nth fail addresses FAD1~FADn.

The repair address provision section 20 provides a repair address RPA corresponding to the fail address identical to the comparison address CAD according to the first to the nth detection signals DS1~DSn. An address enable signal AE is activated when the repair address RPA is provided.

In the fail address detector 1 in FIG. 1 and FIG. 2, each of the cam latch groups includes numerous latch blocks (51 in FIG. 2), comparators (52 in FIG. 2) and the cam latch decoding circuit (40 in FIG. 2). The area of the fail address detector 1 will increase sharply according to the number of needed fail address augments.

FIG. 3 is a block diagram of a semiconductor memory device 100 according to at least one example embodiment.

In FIG. 3, the semiconductor memory device 100 includes a memory cell array 110, a peripheral circuit 120 for driving the memory cell array 110 and a control logic 130 for controlling the peripheral circuit 120.

The memory cell array 110 is connected to an address decoder 121 through word lines WL, and it is connected to a read and write circuit 122 through bit lines BL. The memory cell array 110 includes a plurality of memory blocks which will be described in detail with reference to FIG. 4.

The memory cell array 110 includes memory cells. Memory cells in a row direction are connected to the word lines WL. Memory cells in a column direction are connected to the bit lines BL. Each of the memory cells may be a single level cell or a multi level cell. If the memory cells are single level cells, memory cells connected to one word line form one memory page. If the memory cells are multi level cells, memory cells connected to one word line form two or more memory pages.

The peripheral circuit 120 includes the address decoder 121 and the read and write circuit 122.

The address decoder 121 is connected to the memory cell array 110 through the word lines WL. The address decoder 121 operates in response to control of the control logic 130. The address decoder 121 receives an output address OAD from the control logic 130.

The address decoder 121 decodes a block address of the received output address OAD. The address decoder 121 selects one memory block according to the decoded block address.

The address decoder 121 further decodes a row address of the received output address OAD. The address decoder 121 selects one of the word lines WL in the selected memory block according to the decoded row address.

The address decoder 121 also decodes a column address of the received output address OAD, and transmits the decoded column address Yi to the read and write circuit 122.

In at least one embodiment, a read operation and a program operation of the semiconductor memory device are performed in the unit of memory page. In the read operation and the program operation, the output address OAD may include a block address, a row address and a column address. The address decoder 121 selects one memory block and one word line according to the output address OAD, and provides the decoded column address Yi to the read and write circuit 122 as described above.

In at least one embodiment, an erase operation of the semiconductor memory device is performed in the unit of memory block. In the erase operation, the output address OAD includes a block address. The address decoder 121 selects one memory block according to the output address OAD as described above.

The address decoder 121 may include a block decoder, a row decoder, a column decoder and an address buffer, etc.

The read and write circuit 122 is connected to the memory cell array 110 through the bit lines BL. The read and write circuit 122 operates in response to control of the control logic 130.

In the program operation and the read operation, the read and write circuit 122 exchanges data with an outside device or an input/output buffer (not shown) of the semiconductor memory device 100. In the program operation, the read and write circuit 122 receives data DATA, and provides the received data DATA to the bit lines corresponding to the decoded column address Yi. The provided data DATA is programmed into the memory cells corresponding to the selected word line. In the read operation, the read and write circuit 122 reads data from memory cells of the selected word line through the bit lines corresponding to the decoded column address Yi, and outputs the read data DATA.

In at least one embodiment, the read and write circuit 122 may include memory page buffers (or memory page registers) and a column selection circuit, etc.

The control logic 130 is connected to the address decoder 121 and the read and write circuit 122. The control logic 130 receives a control signal CMD from an outside device or the input/output buffer (not shown) of the semiconductor memory device 100. The control logic 130 controls operation of the semiconductor memory device 100 in response to the control signal CMD.

The control logic 130 receives an input address IAD. The control logic 130 converts data bits corresponding to a fail address, if present in the input address IAD, into data bits corresponding to the corresponding repair address, and generates the output address OAD in accordance with the conversion. The control logic 130 transmits the generated output address OAD to the address decoder 121.

A fail address is an address representing a defect area of the semiconductor memory device 100. For example, the fail address may be an address representing any one among various defect areas, such as a defect memory block of the memory cell array 110, a defect memory page of the memory cell block 110, a defect word line of the word lines WL, a defect bit line of the bit lines BL, a defect memory cell of the memory cell array 110 and so on.

The repair address indicates a redundancy area for replacing the defect area corresponding to the fail address. For example, the repair address may be an address representing a redundancy memory block for replacing the defect memory block, a redundancy memory page or a redundancy word line for replacing the defect memory page or the defect word line, a redundancy bit line for replacing the defect bit line and a redundancy memory cell for replacing the defect memory cell.

The control logic 130 includes a fail address detector 131. The fail address detector 131 receives a comparison address in the input address IAD, detects whether or not the comparison address is identical to a fail address, and generates a repair address corresponding to the fail address if present. The comparison address in the input address IAD is replaced with the repair address, and the output address OAD is generated according to the replacement. For example, if the input address IAD includes data bits representing a defect bit line, the data bits of the input address IAD are replaced with the corresponding repair address of a redundancy bit line, and the output address OAD is generated according to the replacement.

The semiconductor memory device 100 may further include an input/output buffer (not shown in FIG. 1). The input/output buffer receives the control signal CMD and the input address IAD from an outside device, and delivers the received control signal CMD and the input address IAD to the control logic 130. Additionally, the input/output buffer provides the data DATA inputted from an outside device to the read and write circuit 122, and delivers data DATA provided from the read and write circuit 122 to the outside device.

In at least one embodiment, the semiconductor memory device 100 may be a flash memory device.

Figure 4:
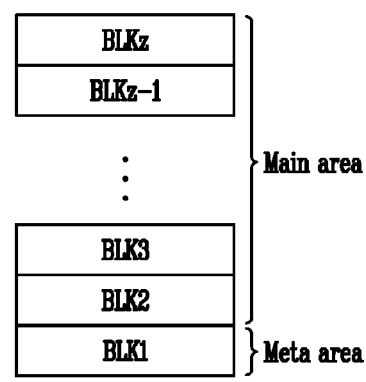
FIG. 4 is a block diagram of a memory cell array according to at least one example embodiment.

FIG. 4 is a block diagram of the memory cell array 110 in FIG. 3, according to at least one example embodiment.

In FIG. 4, the memory cell array 110 includes memory blocks BLK1~BLKz. Each of the memory blocks BLK1~BLKz has memory cells. In at least one embodiment, the memory cells are non-volatile memory cells.

The memory blocks BLK1~BLKz are divided into a main area and a meta area. The main area is an area where data (DATA in FIG. 3), e.g., inputted from an outside device, is stored. The meta area is an area where meta data, for managing the semiconductor memory device (100 in FIG. 3), e.g., one or more fail addresses representing defect areas of the semiconductor memory device 100 and algorithms of the semiconductor memory device 100, is stored.

The control logic 130 loads the fail addresses in the meta area to the fail address detector 131. For example, the loading operation may be performed when the semiconductor memory device 100 is powered-up.

The redundancy area for replacing the defect area may be provided, and it is not shown. For example, the zth memory block BLKz is a redundancy memory block for replacing a defect memory block among the first to (z−1)th memory blocks BLK1~BLKz−1. In at least one embodiment, each of the memory blocks may include a redundancy memory page or a redundancy word line for replacing a defect memory page or a defect word line, respectively. For example, a redundancy word line for replacing a defect word line among the word lines connected to each of the memory blocks is provided. Furthermore, a redundancy bit line for replacing a defect bit line among the bit lines connected to each of the memory blocks is provided. In at least one example embodiment, the redundancy bit line or word line includes redundancy memory cells for replacing the memory cells of the defect bit line or word line, and/or is placed outside the memory block having the defect bit line or word line.

Figure 5:
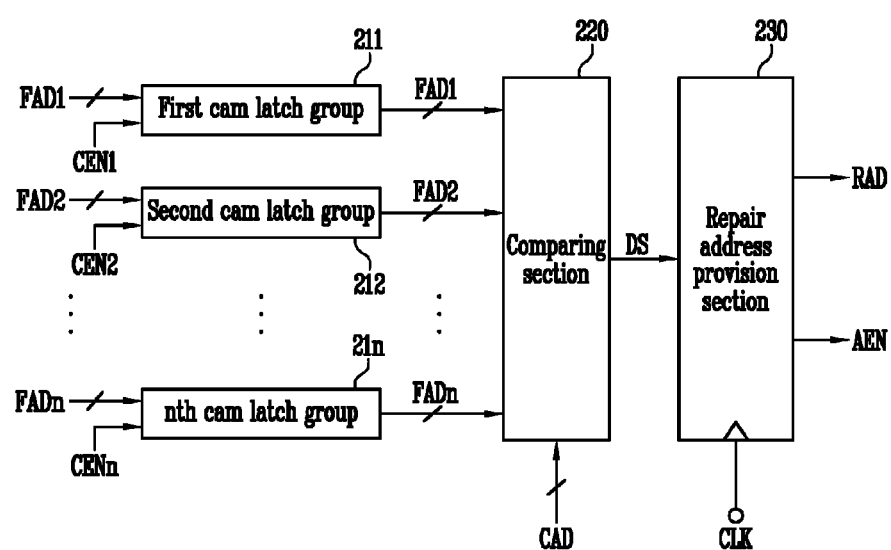
FIG. 5 is a block diagram of a fail address detector according to at least one example embodiment.

FIG. 5 is a block diagram of a fail address detector according to at least one example embodiment.

In FIG. 5, the fail address detector 131 includes a first to an nth cam latch groups 211~21n, a comparing section 220 and a repair address provision section 230.

The first to the nth cam latch groups 211~21n receive a first to an nth fail addresses FAD1~FADn, respectively. Here, the fail addresses are addresses representing defect areas of the semiconductor memory device 100, respectively. For example, each of the fail addresses may be one of a block address representing a defect memory block, a row address representing a defect memory page or a defect word line, and a column address representing a defect bit line. In at least one embodiment, the fail addresses are read from the meta area(s) of the memory cell array (110 in FIG. 3, BLK1 in FIG. 4) upon power-up.

The first to the nth cam latch groups 211~21n receive a first to an nth cam enable signals CEN1~CENn, respectively. The first to the nth cam latch groups 211~21n operates in response to the first to the nth cam enable signals CEN1~CENn, respectively.

The first to the nth cam latch groups 211~21n are connected in common to the comparing section 220. The first to the nth cam latch groups 211~21n share the comparing section 220. Each cam latch group provides the received fail address to the comparing section 220 in response to the corresponding cam enable signal. For example, the first cam latch group 211 outputs the first fail address FAD1 in response to the first cam enable signal CEN1. The second cam latch group 212 outputs the second fail address FAD2 in response to the second cam enable signal CEN2. The nth cam latch group 21n outputs the nth fail address FADn in response to the nth enable signal CENn.

The first to the nth cam enable signals CEN1~CENn are activated in sequence. Accordingly, the first to the nth fail addresses FAD1~FADn are provided in sequence to the comparing section 220. That is, the first to the nth cam latch groups 211~21n share the comparing section 220 in time division.

The comparing section 220 is connected to the first to the nth cam latch groups 211~21n. The comparing section 220 receives a comparison address CAD. Here, the comparison address CAD may be one of a block address, a row address and a column address in the input address (IAD in FIG. 3) received by the control logic (130 in FIG. 3).

The comparing section 220 sequentially receives the fail address FAD1~FADn from the first to nth cam latch group 211~21n and detects whether or not the received fail address is identical to the comparison address CAD. If the detection result indicates that the comparison address CAD matches one of the fail address FAD1~FADn, the comparing section 220 transmits a detection signal DS to the repair address provision section 230.

The repair address provision section 230 receives the detection signal DS from the comparing section 220. The repair address provision section 230 operates in response to a clock signal CLK. The repair address provision section 230 provides a repair address in response to the detection signal DS. In other words, the repair address provision section 230 provides the corresponding repair address when the fail address corresponding to the comparison address CAD exists among the first to the nth fail addresses FAD1~FADn.

In at least one embodiment, the repair address provision section 230 may generate repair addresses RAD in response to the clock signal CLK. For example, the repair addresses RAD may be addresses increasing in sequence by a given address value. For example, when the repair addresses RAD are addresses representing redundancy bit lines, a first repair address (e.g., RAD<1> in FIG. 10) may represent a first redundancy bit line, a second repair address (e.g., RAD<2> in FIG. 10) may represent a second redundancy bit line, and an nth repair address (e.g., RAD<n> not labeled in the drawings) may represent an nth redundancy bit line. The repair addresses RAD<1>, RAD<2> to RAD<n> are sequentially outputted, in accordance with the clock signal CLK, via the output RAD of the repair address provision section 230, to the control logic (130 in FIG. 3). The repair address provision section 230 may activate an address enable signal AEN when the detection signal DS is activated, and outputs the activated address enable signal AEN, via the output AEN, to the control logic 130. The control logic 130 determines the repair address RAD<j> (where j=1~n), which is present at the output RAD of the repair address provision section 230 at an activation time of the address enable signal AEN, as the repair address corresponding to the comparison address CAD. The control logic 130 replaces the comparison address CAD in the input address (IAD in FIG. 3) with the determined repair address RAD<j>, and generates the output address OAD according to the replacement. Other arrangements for outputting the repair address RAD<j> corresponding to the comparison address CAD are within the scope of various embodiments. For example, in at least one embodiment, the repair addresses RAD<1>, RAD<2> to RAD<n> are sequentially generated inside the repair address provision section 230 which outputs, to the control logic 130 and via the output RAD, only the repair address RAD<j> corresponding to the comparison address CAD in accordance with the activated address enable signal AEN.

In at least one embodiment, the cam latch groups 211~21n do not receive the comparison address CAD. Each of the cam latch groups 211~21n does not include an element for comparing the corresponding fail address with the comparison address CAD. The fail addresses FAD1~FADn are compared with the comparison address CAD by the comparing section 220. Accordingly, the area of the fail address detector 131 may be reduced.

Figure 6:
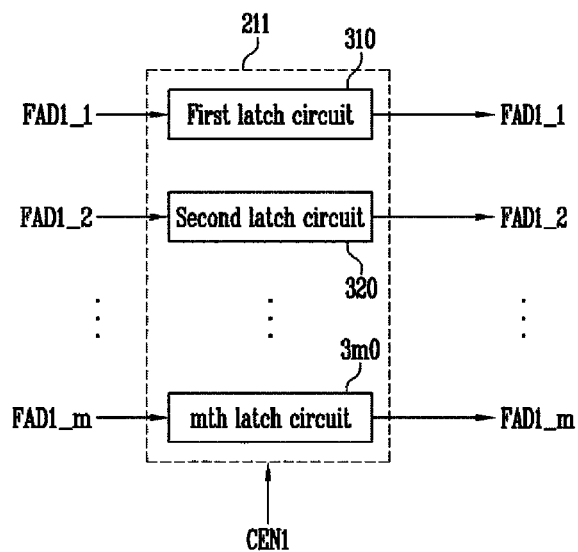
FIG. 6 is a block diagram of one cam latch group in the fail address detector of FIG. 5, according to at least one example embodiment.

FIG. 6 is a block diagram of the cam latch group 211 in FIG. 5, according to at least one example embodiment.

In FIG. 5 and FIG. 6, the first cam latch group 211 includes a first to an mth latch circuits 310~3m0. The first to the mth latch circuits 310~3m0 operate in response to the first cam enable signal CEN1.

The first to the mth latch circuits 310~3m0 receive data bits FAD1_1~FAD1_m of the first fail address FAD1, respectively. Each of the first to the mth latch circuits 310~3m0 outputs the corresponding data bit in response to the first cam enable signal CEN1.

Accordingly, a time at which the data bits FAD1_1~FAD1_m of the first fail address FAD1 are provided to the comparing section 220 may differ according to a time at which the first cam enable signal CEN1 is activated.

The second to nth cam latch groups 212~21n in FIG. 5 have the same configuration as the first cam latch group 211 in FIG. 6.

Figure 7:
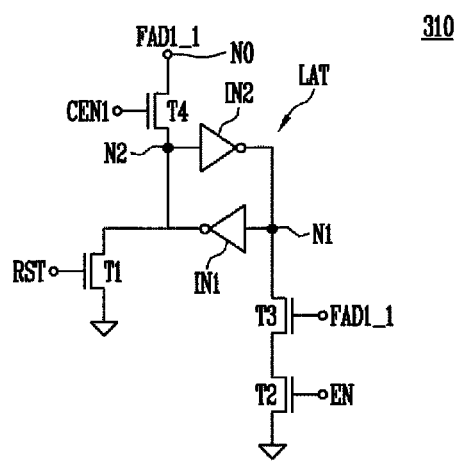
FIG. 7 is a circuit diagram of one latch circuit in the cam latch group of FIG. 6, according to at least one example embodiment.

FIG. 7 is a circuit diagram of the latch circuit 310 in FIG. 6, according to at least one example embodiment.

In FIG. 7, a first latch circuit 310 operates in response to a reset signal RST and an access enable signal EN as well as the first cam enable signal CEN1 which are provided by the control logic 130.

The first latch circuit 310 includes a first to a fourth transistors T1~T4 and a latch LAT. The first transistor T1 is connected between the latch LAT and a reference node, and operates in response to the reset signal RST. The latch LAT may be initialized in response to the reset signal RST.

A second and a third transistors T2 and T3 are connected serially between the reference node and a first node N1. The second transistor T2 is turned on in response to the access enable signal EN. The third transistor T3 is turned on or off in response to an appropriate logic value of a first data bit FAD1_1 of the first fail address FAD1 loaded from the meta area(s) of the memory cell array (110 in FIG. 3). The access enable signal EN has logic high value when the first fail address FAD1 is loaded from the memory cell array (110 in FIG. 3). As a result, the second transistor T2 is turned on. The third transistor T3 is turned on or off according to the logic value of the first data bit FAD1_1 of the first fail address FAD1, and so a logic value of the first node N1 is determined in accordance with the logic value of the first data bit FAD1_1.

The latch LAT includes a first inverter IN1 and a second inverter IN2, and stores the first data bit FAD1_1 of the first fail address FAD1 as reflected at the first node N1.

The fourth transistor T4 operates in response to the first cam enable signal CEN1. When the first cam enable signal CEN1 has a logic high value, the transistor T4 is turned on and the first data bit FAD1_1 of the first fail address FAD1 stored in the latch LAT is outputted, via a second node N2 which has a reverse logic value to that of the first node N1, via the transistor T4 and via an output node NO, to the comparing section 220.

The second to the mth latch circuits 320~3m0 in FIG. 6 have the same configuration as the first latch circuit 310 in FIG. 7.

Figure 8:
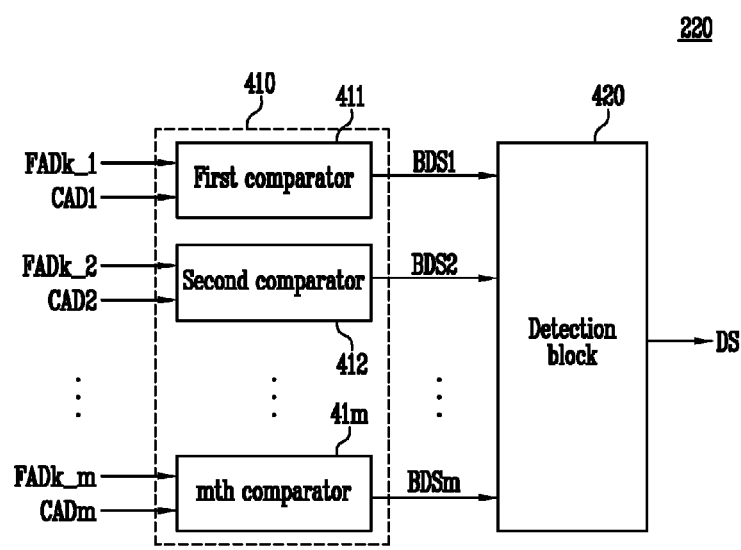
FIG. 8 is a block diagram of a comparing section in the fail address detector of FIG. 5, according to at least one example embodiment.

FIG. 8 is a block diagram of the comparing section 220 in FIG. 5, according to at least one example embodiment.

Referring to FIG. 5 and FIG. 8, the comparing section 220 includes a logic operation block 410 and a detection block 420. The logic operation block 410 includes a first to an mth comparators 411~41m.

The first to the mth comparators 411~41m receive a first to an mth data bits FADk_1~FADk_m of a kth fail address FADk (k is a positive integer between 1 and n), respectively. The first to the mth comparators 411~41m receive the first to the mth data bits CAD1~CADm of the comparison address CAD, respectively.

Each of the first to the mth comparators 411~41m detects whether or not the corresponding data bit of the kth fail address FADk is identical to that of the comparison address CAD. The first to the mth comparators 411~41m output bit detection signals BDS1~BDSm according to the detecting result, respectively. In at least one embodiment, each of the first to the mth comparators 411~41m performs an exclusive OR operation. For example, the first comparator 411 activates the first bit detection signal BDS1 with a logic low value when the first data bit FADk_1 of the kth fail address FADk is identical to a first data bit CAD1 of the comparison address CAD.

The detection block 420 receives the first to the mth bit detection signals BDS1~BDSm from the first to the mth comparators 411~41m, respectively. The detection block 420 activates the detection signal DS when the first to the mth bit detection signals BDS1~BDSm are all activated. If any one of the first to the mth bit detection signals BDS1~BDSm is not activated, the detection block 420 does not activate the detection signal DS. The activation of the detection signal DS indicates that data bits FADk_1~FADk_m of the kth fail address FADk are identical to data bits CAD1~CADm of the comparison address CAD. The repair address provision section 230 provides the repair address RAD corresponding to the comparison address CAD according to the timing when the detection signal DS is activated.

Figure 9:
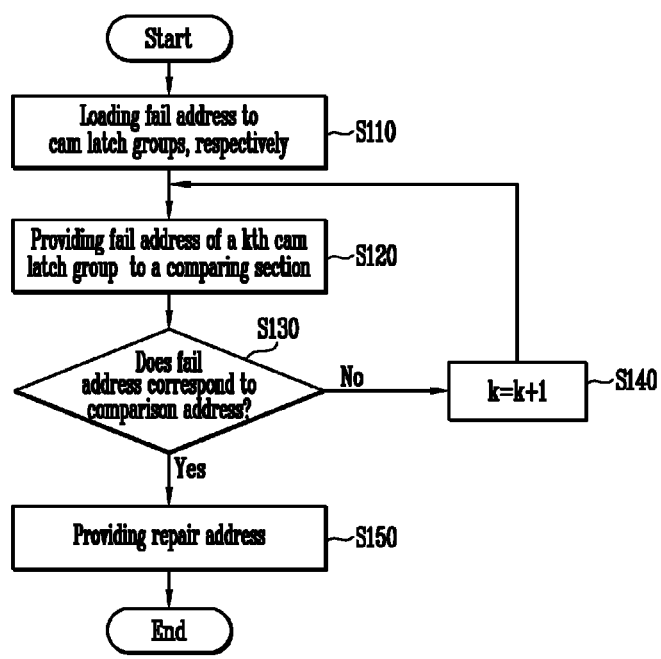
FIG. 9 is a flowchart of a method of detecting fail address according to at least one example embodiment.

FIG. 9 is a flowchart of a method of detecting fail address according to at least one example embodiment.

Referring to FIG. 5 and FIG. 9, the fail addresses FAD1~FADn are loaded, e.g., upon power-up, to the cam latch groups 211~21n from the memory cell array 110 in step S110.

In step S120, the fail address loaded to the kth cam latch group is provided to the comparing section 220. For example, the first fail address FAD1 of the first cam latch group 211 is provided to the comparing section 220.

In step S130, the comparing section 220 detects whether or not the provided fail address corresponds to the comparison address CAD. The detection signal DS is provided according to the detecting result. For example, it is detected whether or not the first fail address FAD1 is identical to the comparison address CAD. If the first fail address FAD1 is not identical to the comparison address CAD, step S140 is performed. If the first fail address FAD1 is identical to the comparison address CAD, step S150 is performed.

In the step S140, k increases by 1, and then the step S120 is again performed. For example, the second fail address FAD2 of the second cam latch group 212 is provided to the comparing section 220. That is, the first to the nth fail addresses FAD1~FADn are provided in sequence from the first to the nth cam latch groups 211~21n to the comparing section 220.

In the step S150, the repair address corresponding to the comparison address CAD is provided. The repair address provision section 230 generates the repair address RAD corresponding to the comparison address CAD in response to the activation of the detection signal DS.

FIG. 10 is a timing diagram of operation of the fail address detector in FIG. 5, according to at least one example embodiment. In FIG. 10, it is assumed that a fourth fail address FAD4 is identical to the comparison address CAD.

Referring to FIG. 5 and FIG. 10, the repair address provision section 230 sequentially generates or outputs repair addresses RAD<1>~RAD<4> in response to the clock signal CLK.

The first to the fourth cam enable signals CEN1~CEN4 are activated, one at a time, in sequence in synchronization with the clock signal CLK. The first cam latch group 211 transmits the first fail address FAD1 to the comparing section 220 when the first cam enable signal CEN1 is activated. The comparing section 220 compares the first fail address FAD1 with the comparison address CAD. Because the first fail address FAD1 does not match the comparison address CAD, the detection signal DS is not activated and has a logic high value.

Subsequently, the second cam enable signal CEN2 is activated. The second cam latch group 212 transmits the second fail address FAD2 to the comparing section 220. The comparing section 220 detects whether or not the second fail address FAD2 is identical to the comparison address CAD. Because the second fail address FAD2 does not match the comparison address CAD, the detection signal DS is not activated and still has the logic high value.

The third cam enable signal CEN3 is next activated. The third fail address FAD3 is transmitted to the comparing section 220. The comparing section 220 compares the third fail address FAD3 with the comparison address CAD. Because the third fail address FAD3 does not match the comparison address CAD, the detection signal DS is not activated and still has the logic high value.

The fourth cam enable signal CEN4 is next activated. The fourth fail address FAD4 is transmitted to the comparing section 220. Since the fourth fail address FAD4 is identical to the comparison address CAD, the comparing section 220 activates the detection signal DS with a logic low value.

The repair address provision section 230 activates an address enable signal AEN with a logic high value in response to the activation of the detection signal DS. A repair address RAD<4> at the activation time of the address enable signal AEN is determined as the repair address corresponding to the comparison address CAD. That is, the repair address RAD<4> generated or outputted by the repair address provision section 230 when the address enable signal AEN is activated is determined as the repair address corresponding to the comparison address CAD. The control logic 130 replaces the comparison address CAD in the input address IAD with the repair address RAD<4>, and generates the output address OAD according to the replacing result.

In at least one embodiment, various fail addresses are compared with the comparison address by a common comparing section. Accordingly, the area of the fail address detector may be reduced, and thus the area of the semiconductor memory device may be reduced.

What is claimed is:

1. A fail address detector, comprising:
cam latch groups configured to store fail addresses, respectively, wherein each of the fail addresses indicates a defect area; and
a comparing section connected to the cam latch groups in common and configured to detect whether or not a fail address corresponding to a comparison address exists among the fail addresses received from the cam latch groups,
wherein the cam latch groups are configured to share the comparing section in time division by sequentially transmitting the fail addresses to the comparing section,
wherein the cam latch groups are configured to receive cam enable signals, respectively, the cam enable signals being activated sequentially, and
wherein the cam latch groups are configured to sequentially transmit the fail addresses to the comparing section in response to the cam enable signals, respectively.

2. The fail address detector of claim 1, further comprising:
a repair address provision section connected to the comparing section and configured to provide a repair address when the fail address corresponding to the comparison address exists.

3. The fail address detector of claim 1, wherein each of the cam latch groups is configured to not receive the comparison address.

4. The fail address detector of claim 1, wherein the comparing section includes:
a logic operation block configured to detect whether or not data bits of the comparison address are identical to corresponding data bits of the fail address received from each of the cam latch groups; and
a detection block configured to output a detection signal according to a detecting result of the logic operation block.

5. The fail address detector of claim 4, further comprising:
a repair address provision section connected to the comparing section and configured to generate repair addresses in sequence in response to a clock signal, and to provide an address enable signal according to the detection signal.

6. The fail address detector of claim 5, wherein the fail address detector is configured to determine, among the repair addresses generated in sequence, a repair address corresponding to the comparison address according to the address enable signal.

7. The fail address detector of claim 1, wherein each of the cam latch groups includes latch circuits for storing data bits of the corresponding fail address.

8. The fail address detector of claim 7, wherein each of the latch circuits includes:
a latch;
a first transistor and a second transistor connected serially between a first node of the latch and a reference node; and
a third transistor connected between a second node of the latch and an output node, and
wherein the first transistor is configured to be turned on in response to a read control signal, the second transistor is configured to be turned on or off in response to one of the data bits of the corresponding fail address, and the third transistor is configured to be turned on in response to the corresponding cam enable signal.

9. A method of detecting fail address, the method comprising:
loading fail addresses to cam latch groups, respectively, wherein each of the fail addresses indicates a defect area;
providing the fail addresses in sequence to a comparing section connected in common to the cam latch groups, in response to sequentially activated cam enable signals, respectively; and
sequentially comparing the fail addresses provided from the cam latch groups to the comparing section with a comparison address to detect whether or not a fail address corresponding to the comparison address exists among the fail addresses.

10. The method of claim 9, further comprising:
providing a repair address when the fail address corresponding to the comparison address exists.

11. The method of claim 9, further comprising:
outputting a detection signal when the fail address corresponding to the comparison address exists.

12. The method of claim 11, further comprising:
sequentially generating repair addresses in response to a clock signal; and
generating an address enable signal in response to the detection signal.

13. The method of claim 12, further comprising:
determining, among the sequentially generated repair addresses, a repair address corresponding to the comparison address according to the address enable signal.

14. The method of claim 13, wherein, in said determining, the repair address generated at a time of activation of the address enable signal is determined as the repair address corresponding to the comparison address.

15. The method of claim 11, further comprising:
sequentially generating repair addresses in response to a clock signal;
determining, among the sequentially generated repair addresses, a repair address generated at a time of activation of the detection signal as a repair address corresponding to the comparison address; and
accessing an area of a memory cell array in accordance with the repair address corresponding to the comparison address.

16. A semiconductor memory device, comprising:
a memory cell array;
a peripheral circuit configured to drive the memory cell array; and
a control logic configured to control the peripheral circuit, wherein the control logic includes:
cam latch groups configured to store fail addresses loaded from the memory cell array, respectively, wherein each of the fail addresses indicates a defect area of the memory cell array; and
a comparing section which is connected to the cam latch groups in common to be shared in time division by the cam latch groups, and which is configured to detect whether or not a fail address corresponding a comparison address exists among the fail addresses received from the cam latch groups,
wherein the cam latch groups are configured to receive cam enable signals, respectively, the cam enable signals being activated sequentially, and
wherein the cam latch groups are configured to sequentially transmit the fail addresses to the comparing section in response to the cam enable signals, respectively.

17. The semiconductor memory device of claim 16, wherein the control logic further includes a repair address provision section connected to the comparing section and configured to provide a repair address when the fail address corresponding to the comparison address exists.

18. The semiconductor memory device of claim 17, wherein the control logic is configured to provide the repair address to the peripheral circuit instead of the comparison address.

19. The semiconductor memory device of claim 18, wherein the peripheral circuit is configured to access an area of the memory cell array corresponding to the repair address.

* * * * *